(12) United States Patent
Shimoyama

(10) Patent No.: US 10,343,401 B2
(45) Date of Patent: Jul. 9, 2019

(54) DROPLET EJECTION APPARATUS

(71) Applicant: CANON KABUSHIKI KAISHA, Tokyo (JP)

(72) Inventor: Hiroyuki Shimoyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/895,301

(22) Filed: Feb. 13, 2018

(65) Prior Publication Data
US 2018/0250934 A1    Sep. 6, 2018

(30) Foreign Application Priority Data

Mar. 2, 2017  (JP) ................... 2017-039729
Dec. 8, 2017  (JP) ................... 2017-236397

(51) Int. Cl.
| | | |
|---|---|---|
| B41J 2/16 | (2006.01) | |
| B41J 2/14 | (2006.01) | |
| H01L 41/04 | (2006.01) | |
| H01L 41/09 | (2006.01) | |
| H01L 41/047 | (2006.01) | |
| H01L 41/187 | (2006.01) | |

(52) U.S. Cl.
CPC ......... *B41J 2/1433* (2013.01); *B41J 2/14201* (2013.01); *B41J 2/162* (2013.01); *B41J 2/1607* (2013.01); *B41J 2/1623* (2013.01); *B41J 2/1626* (2013.01); *B41J 2/1634* (2013.01); *B41J 2/1637* (2013.01); *B41J 2002/14306* (2013.01); *B41J 2202/22* (2013.01); *H01L 41/042* (2013.01); *H01L 41/0475* (2013.01); *H01L 41/0973* (2013.01); *H01L 41/1876* (2013.01)

(58) Field of Classification Search
CPC ...... B41J 2/1433; B41J 2/1637; B41J 2/1623; B41J 2/162; B41J 2/1607; B41J 2/14201; B41J 2/1634; B41J 2/1626; B41J 2202/22; B41J 2002/14306; H01L 41/0973; H01L 41/042; H01L 41/0475; H01L 41/1876
See application file for complete search history.

(56) References Cited

FOREIGN PATENT DOCUMENTS

| JP | 2012-192641 A |   | 10/2012 |
|----|---------------|---|---------|
| JP | 2012192641 A  | * | 10/2012 |

* cited by examiner

Primary Examiner — Bradley W Thies
(74) Attorney, Agent, or Firm — Venable LLP

(57) ABSTRACT

A flow path unit is formed by laminating a plurality of lamination plates, and has a first damper chamber extending in a manner overlapping with a plurality of pressure chambers with respect to a longitudinal direction in which the plurality of pressure chambers is aligned, as seen from an opening side of a plurality of nozzles. The first damper chamber is provided at a height between the pressure chamber and the common liquid chamber, as measured along the laminating direction in which the plurality of lamination plates is laminated, and a first support part is provided inside the first damper chamber.

18 Claims, 8 Drawing Sheets

DROPLET EJECTION APPARATUS

BACKGROUND OF THE INVENTION

Field of the Invention

The present invention relates to a droplet ejection apparatus.

Description of the Related Art

There is known, as a droplet ejection apparatus that ejects droplets from nozzles, an apparatus configured to eject droplets individually from a plurality of nozzles by selectively applying pressure on liquid in a pressure chamber. In a case where droplets are ejected from one of the nozzles in the droplet ejection apparatus, ejection of droplets from nozzles other than the one that has ejected droplets may be affected since a residual pressure in a pressure chamber in communication with the nozzle may propagate to other pressure chambers via a common liquid chamber.

Japanese Patent Laid-Open No. 2012-192641 has disclosed therein a technique of arranging a plurality of damper chambers between a common liquid chamber and a plurality of pressure chambers with a same pitch as that of the plurality of pressure chambers, and providing communication holes in the damper chambers to be in communication with the common liquid chamber, thereby suppressing pressure variation that may occur in the common liquid chamber.

To improve the droplet ejection precision in the droplet ejection apparatus, it is conceivable to employ a configuration in which a plurality of nozzles is arranged with a high density. Arranging a plurality of nozzles with a high density results in that the pressure chambers in communication with the nozzles are also arranged with a high density. Using the technique in Japanese Patent Laid-Open No. 2012-192641 results in that the plurality of damper chambers arranged with a same pitch as that of the plurality of pressure chambers is also arranged with a high density. Accordingly, each damper chamber itself turns out to be inevitably down-sized, so that there may be a risk of failing to obtain a sufficient effect of suppressing the pressure variation that may occur in the common liquid chamber.

SUMMARY OF THE INVENTION

The droplet ejection apparatus according to one aspect of the present invention includes a flow path unit having formed therein a liquid flow path including a plurality of nozzles, a plurality of pressure chambers respectively in communication with each of the plurality of nozzles, and a common liquid chamber in communication with the plurality of pressure chambers, and an actuator configured to selectively apply pressure on liquid in the plurality of pressure chambers, wherein the flow path unit is formed by laminating a plurality of lamination plates, the flow path unit further has a first damper chamber extending in a manner overlapping with the plurality of pressure chambers with respect to a longitudinal direction in which the plurality of pressure chambers is aligned, as seen from an opening side of the plurality of nozzles, the first damper chamber is provided at a height between the pressure chamber and the common liquid chamber, as measured along the laminating direction in which the plurality of lamination plates is laminated, and a first support part is provided inside the first damper chamber.

Further features of the present invention will become apparent from the following description of exemplary embodiments with reference to the attached drawings.

DESCRIPTION OF THE EMBODIMENTS

Hereinafter, preferred embodiments of the present invention will be described on the basis of drawings. However, relative location of components, shape of apparatus and the like described in the embodiments are merely illustrative and not intended to limit the scope of the invention. In the embodiments described below, description will be provided taking an inkjet printer including inkjet heads that eject droplets of ink onto print sheets as an example of a droplet ejection apparatus.

Embodiment 1

Figure 1:
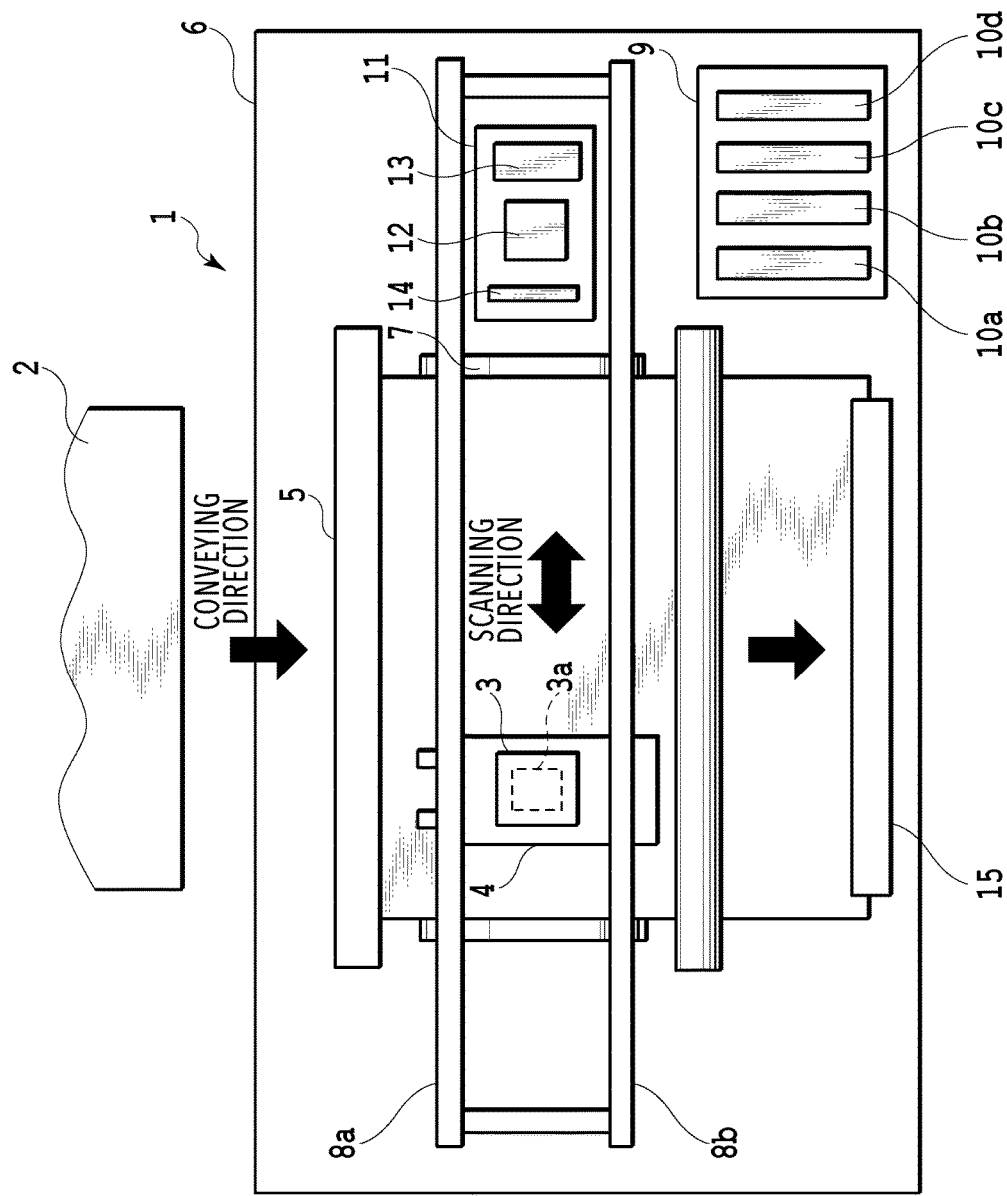
FIG. 1 is a schematic plan view of an inkjet printer.

First, the overall configuration of an inkjet printer 1 of the present embodiment will be described. FIG. 1 is a schematic plan view of the inkjet printer 1 of the present embodiment. The inkjet printer 1 has an inkjet head 3 for printing images or the like on a print sheet 2, a carriage 4 configured to be reciprocally movable along a scanning direction of FIG. 1, and a conveying mechanism 5 for conveying the print sheet 2 in a conveying direction which is perpendicular to the scanning direction. In a printer casing 6, a platen 7 that supports the print sheet 2 is provided in a horizontal direction. Two guide rails 8a and 8b extending in parallel in the scanning direction are provided above the platen 7. The carriage 4 is driven by a carriage drive motor which is not illustrated, and therefore moves in the scanning direction along the two guide rails 8a and 8b in a region facing the print sheet 2 on the platen 7.

The inkjet head 3 is attached to a lower part of the carriage 4 along the horizontal direction, with a gap existing with the platen 7. The lower surface of the inkjet head 3 turns out to be a droplet ejection unit 3a. In addition, the inkjet head 3 is connected to an ink cartridge holder 9 by a tube which is not illustrated. The ink cartridge holder 9 has four ink cartridges 10a, 10b, 10c and 10d mounted thereon. The four ink cartridges 10a, 10b, 10c and 10d are filled with magenta, cyan, yellow and black inks, respectively. Each of these inks is supplied to the inkjet head 3 via a tube. Note that, in a case where the inkjet head 3 is not used, the inkjet head 3 moves above a maintenance unit 11 along the guide rails 8a and 8b.

The maintenance unit 11 has provided therein a cap 12, a suction pump 13, a wiper 14, or the like. The cap 12 is driven up and down by a cap drive unit (not illustrated) including a driving source, such as a motor, and a power transmission mechanism, such as a gear. The cap 12 performs capping by moving upward by the cap drive unit and contacting the droplet ejection unit 3a of the inkjet head 3. After the capping, the suction pump 13 connected to the cap 12 sucks in air inside the cap 12, thereby depressurizing the interior of the cap 12. Accordingly, suction purge is performed to forcibly discharge ink from the droplet ejection unit 3a of the inkjet head 3 into the cap 12. The suction purge causes air bubble or dust mixed in the ink, or thickened ink, or the like, to be discharged. Such processing suppresses degradation of the quality of droplet ejection. Note that the wiper 14 is provided to perform wiping for wiping off ink sticking to the droplet ejection unit 3a of the inkjet head 3, in a case where the inkjet head 3 moves to the droplet ejection position after the suction purge.

As described above, the inkjet printer 1 causes the inkjet head 3 to eject droplets while moving the inkjet head 3 in the scanning direction, while causing the conveying mechanism 5 to convey the print sheet 2 toward a print sheet discharge unit 15. The inkjet printer 1 is configured to print images, characters or the like on the print sheet 2 through the aforementioned operation.

Figure 2:
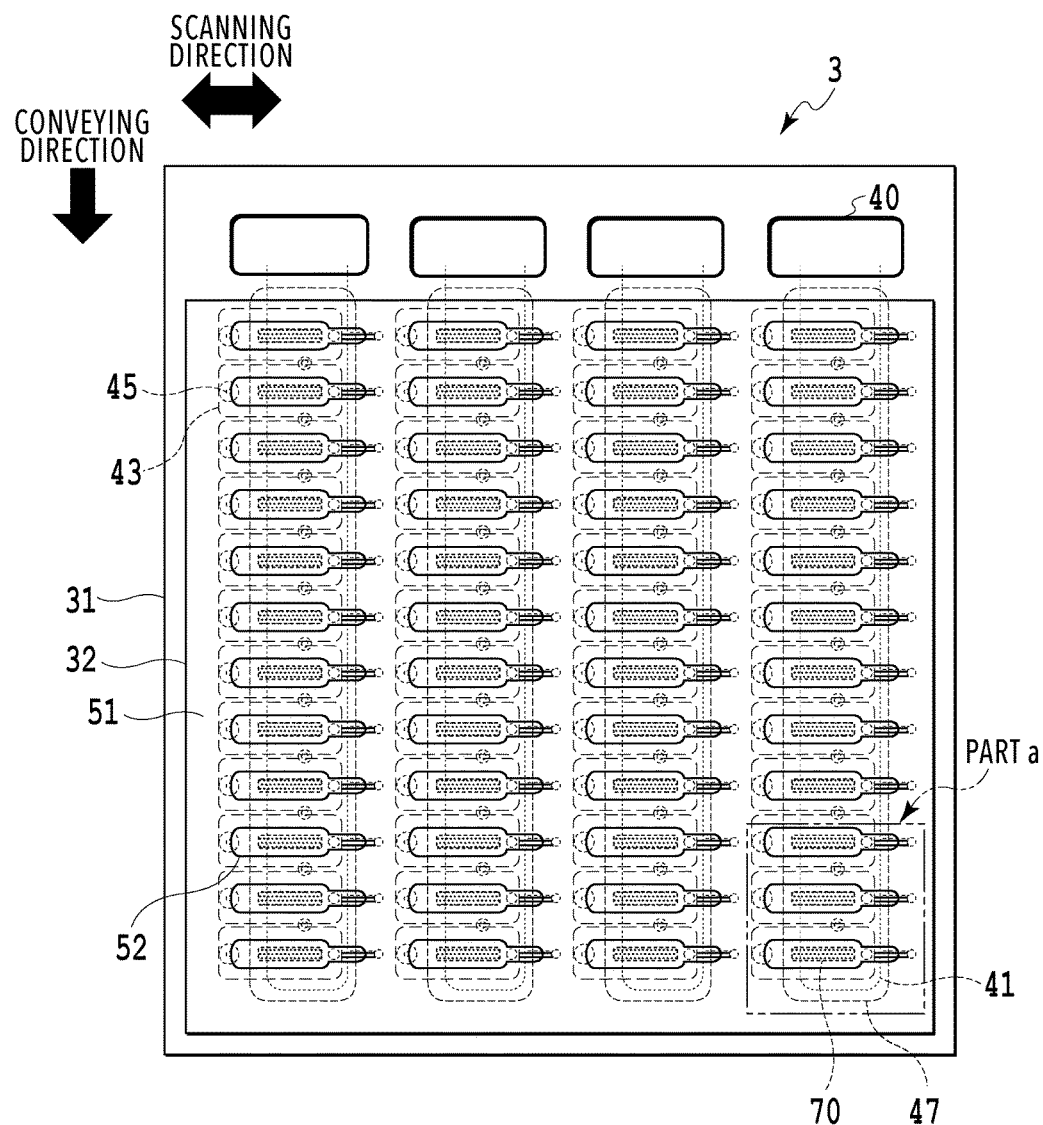
FIG. 2 is a plan view of an inkjet head.
Figure 3:
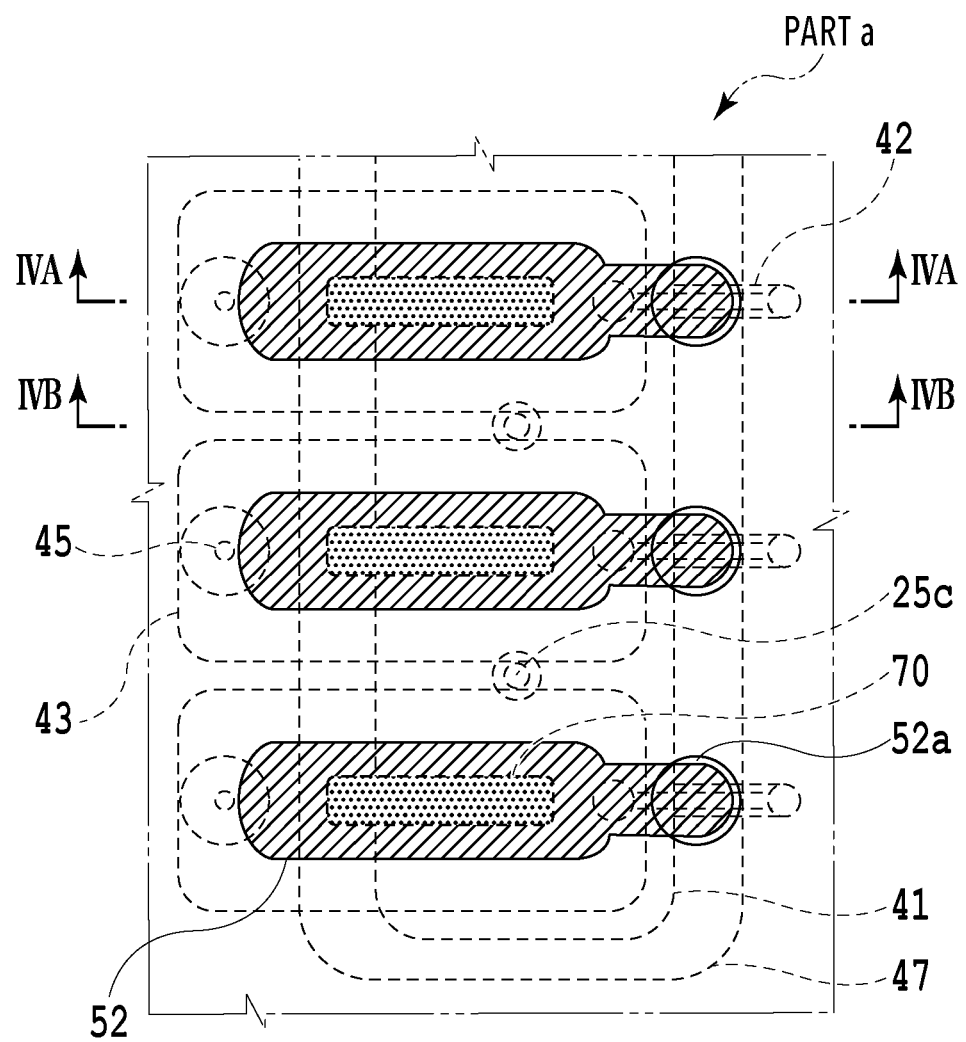
FIG. 3 is a partially enlarged view of FIG. 2.
Figure 4A:
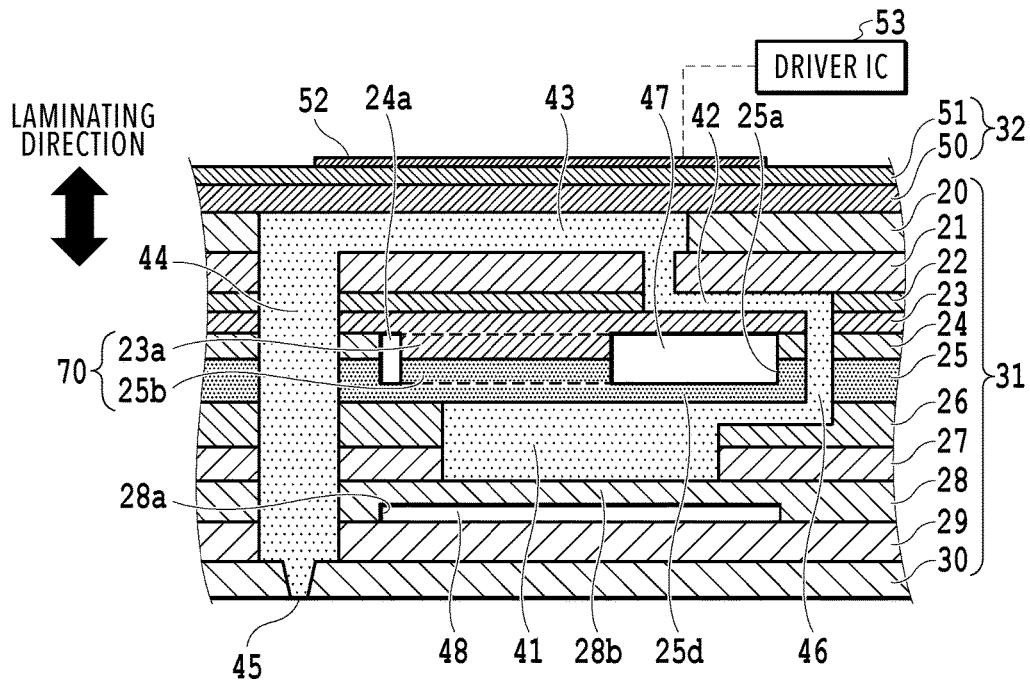
FIG. 4A is a cross-sectional view taken along line IVA-IVA of FIG. 3.
Figure 4B:
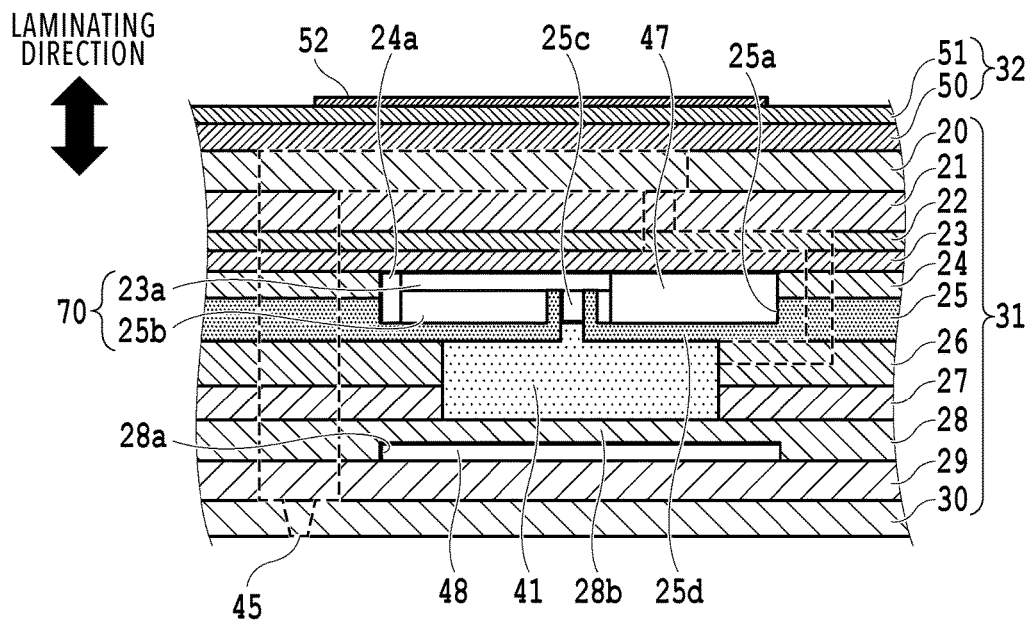
FIG. 4B is a cross-sectional view taken along line IVB-IVB of FIG. 3.

Referring to FIGS. 2 to 4B, the structure of the inkjet head 3 will be described in detail. FIG. 2 is a plan view of the inkjet head 3. FIG. 3 is a partially enlarged view of the part "a" of FIG. 2. FIG. 4A is a cross-sectional view taken along the line IVA-IVA of FIG. 3, and FIG. 4B is a cross-sectional view taken along the line IVB-IVB of FIG. 3. As illustrated in FIGS. 2 to 4B, the inkjet head 3 has a flow path unit 31 having formed therein a liquid flow path (ink flow path) including a nozzle 45 and a pressure chamber 43. The inkjet head 3 has a piezo actuator 32 capable of selectively applying pressure on ink in the pressure chamber 43 in accordance with a print signal or the like.

As illustrated in FIGS. 4A and 4B, the flow path unit 31 in the present embodiment includes eleven lamination plates as described below. First, a cavity plate 20, a base plate 21, an aperture plate 22, a spacer plate 23, a first damper plate 24, and a second damper plate 25 are provided, and subsequently, a first manifold plate 26, a second manifold plate 27, a third damper plate 28, a cover plate 29, and a nozzle plate 30 are provided. The plates 20 to 30 are joined to each other with an adhesive, and, among the plates 20 to 30, the plates 20 to 29, excluding the nozzle plate 30 at the bottom layer, respectively, are metal plates, such as stainless plates or nickel alloy steel plates. On the other hand, the nozzle plate 30 at the bottom layer is made of a synthetic resin material, such as polyimide. Note that these plates are only exemplary, and the number of lamination plates is not limited to the examples illustrated in FIGS. 4A and 4B. As thus described, the flow path unit is formed by laminating a plurality of lamination plates. The direction in which the lamination plates are laminated (upward and downward directions in FIGS. 4A and 4B) is assumed to be the laminating direction.

The flow path unit 31, which is a laminated body of the plates 20 to 30, has four ink supply holes 40 provided therein, as illustrated in FIG. 2. The four ink supply holes 40 are respectively connected to ink cartridges of four colors (magenta, cyan, yellow, and black). The flow path unit 31 has four common liquid chambers 41 provided therein. The four common liquid chambers 41, linearly extending with the ink supply holes 40 being at one end, are respectively in communication with the four ink supply holes 40. Then, as illustrated in FIGS. 2 to 4B, there are provided many individual ink flow paths extending from the common liquid chambers 41 and reaching the nozzle 45 via a second communication flow path 46, an aperture 42, the pressure chamber 43, and a first communication flow path 44. As thus described, the common liquid chambers 41 each have a so-called manifold structure, in which a plurality of flow paths branches out from each of the common liquid chambers 41. The aperture 42 is an aperture-stop flow path, and the second communication flow path 46 has a small flow path area over the aperture 42.

The flow path structure of the flow path unit 31 will be described in detail. The nozzle plate 30 at the bottom layer of the flow path unit 31 has provided therein four rows of nozzle rows in which the plurality of nozzles 45 is arranged in the conveying direction with a predetermined pitch. From the four rows of nozzle rows, inks of four colors are respectively ejected. The cavity plate 20 located at the top layer has provided thereon the plurality of pressure chambers 43 arranged in the conveying direction with a predetermined pitch similarly to the nozzles 45, thereby forming four rows of pressure chamber rows. In addition, the plates 21 to 29 between the cavity plate 20 and the nozzle plate 30 respectively have formed therein through-holes forming the first communication flow path 44 that brings the pressure chamber 43 and the nozzles 45 into communication.

As illustrated in FIG. 2, the four ink supply holes 40 are formed in alignment in the scanning direction at one end of the conveying direction of the cavity plate 20 so as to supply the common liquid chambers 41 with inks of four colors which have been respectively supplied from four ink cartridges. The common liquid chambers 41 are formed respectively corresponding to the four rows of pressure chambers. To put it another way, the four common liquid chambers 41 are formed in the example of FIG. 2. A single member of the common liquid chambers 41 has, in communication therewith, the pressure chambers 43 belonging to a corresponding row of pressure chambers. Note that, although not illustrated, the four common liquid chambers 41 are respectively in communication with the four ink supply holes 40 formed on the cavity plate 20 via the communication flow paths formed in the five plates 21 to 25. The five plates 21 to 25 between the cavity plate 20 and the two manifold plates 26 and 27 have formed thereon the plurality of second communication flow paths 46. The plurality of second communication flow paths 46 includes flow paths bringing a single member of the common liquid chambers 41 into communication with the plurality of pressure chambers 43 respectively corresponding thereto.

Joining the aforementioned plates 20 to 30 in a laminated state results in forming, in the flow path unit 31, an ink flow path from the ink supply holes 40 to the common liquid chamber 41, the second communication flow path 46 from the common liquid chamber 41 to the pressure chamber 43, and the pressure chamber 43. In addition, there is formed an individual ink flow path from the pressure chamber 43 to the nozzles 45 via the first communication flow path 44.

Two types of damper chambers 47 and 48 will be described. The flow path unit 31 of the present embodiment has formed therein, in addition to the respective flow paths described above, a first damper chamber 47 and a second damper chamber 48 for attenuating the pressure variation in the common liquid chamber 41. The first damper chamber 47 and the second damper chamber 48 are respectively arranged in a manner sandwiching the common liquid chamber 41 in the vertical direction (laminating direction of the plates 20 to 30). In other words, the common liquid chamber 41 is arranged between the first damper chamber 47 and the second damper chamber 48 in the vertical direction. The first damper chamber 47 is provided above the common liquid chamber 41. More specifically, the first damper chamber 47 is formed at a height between the pressure chamber 43 and the common liquid chamber 41, within the height along the laminating direction in which the plurality of lamination plates is laminated. Although it is preferred that the first damper chamber 47 is formed on a hypothetical line connecting the pressure chamber 43 and the common liquid chamber 41, it may be formed at a position offset from the hypothetical line connecting both chambers, provided that it is formed so that the height in the laminating direction exists between both chambers. The second damper chamber 48 is provided below the common liquid chamber 41. As illustrated in FIGS. 4A and 4B, the first damper chamber 47 is formed of the first damper plate 24 and the second damper plate 25. As illustrated in FIG. 2, the first damper chamber 47 extends in the conveying direction in a manner facing the common liquid chamber 41 in the laminating direction. In addition, as illustrated in FIGS. 2 to 4B, the first damper chamber 47 is provided in a manner covering the common liquid chamber 41. In other words, the widths of the first damper chamber 47 in the scanning direction and the conveying direction (direction perpendicular to the laminating direction of the plates) of FIG. 2 are respectively equal to or larger than the width of the common liquid chamber 41. A partition wall 25d between the first damper chamber 47 and the common liquid chamber 41 illustrated in FIG. 4A functions as a damper film which deforms due to pressure variation that has occurred in the common liquid chamber 41. Accordingly, the width of the first damper chamber 47 is preferred to be wider. In the present embodiment, therefore, the first damper chamber 47 is provided in a manner covering the common liquid chamber 41. As illustrated in FIGS. 2 and 3, the first damper chamber 47 is provided in a manner extending so as to overlap with the plurality of pressure chambers 43 in the bottom view of FIGS. 2 and 3 seeing the flow path unit 31 from the opening side of the plurality of nozzles 45. The longitudinal direction of the first damper chamber 47 thus extends in a direction along the direction in which the plurality of pressure chambers 43 is aligned. Accordingly, even in a case where nozzles or pressure chambers are arranged with a high density, the first damper chamber 47 turns out to be provided in a manner overlapping with the plurality of pressure chambers 43. Accordingly, it is possible to preferably suppress pressure variation that may occur in the common liquid chamber even for highly densified nozzles and pressure chambers. In addition, the area of the partition wall 25d functioning as a damper film can be widened, whereby it is possible to suppress pressure variation that may occur in the common liquid chamber. Furthermore, providing the second damper chamber 48 below the common liquid chamber 41 results in further suppressing pressure variation in the common liquid chambers 41. Note that the side opposite to the side illustrated in FIG. 2 is the side at which the plurality of nozzles 45 of the flow path unit 31 opens (opening side), and seeing from the opening side of the nozzles 45 refers to seeing the opening side from a position corresponding to the opening side. Although pressure variation is suppressed by the aforementioned first damper chamber 47 in the present embodiment, the first damper chamber 47 turns out to be larger in the direction of alignment of the pressure chambers 43, and therefore there is a possibility that deformation of the pressure chamber 43 becomes too large. Accordingly, the first damper chamber 47 has a first support part 70 formed therein. Details of the first support part 70 will be described below.

Subsequently, a formation method of the first damper chamber 47 will be described in detail. First, for the first damper plate 24, through-holes 24a aligning in the longitudinal direction (conveying direction) of the common liquid chamber 41 are formed in a part facing the common liquid chamber 41 (the part covering the common liquid chambers 41 as described above). Since the example of FIG. 2 is a configuration with four common liquid chambers 41 provided therein, it turns out that four through-holes 24a are formed in alignment in the conveying direction.

Next, on the second damper plate 25, a concave part 25a which is open upward is formed on the top surface of the part facing the through-hole 24a in the laminating direction. Since the concave part 25a is formed on the top surface of the part facing the through-hole 24a of the first damper plate 24, it turns out that a space occurs on the top surface of the concave part 25a in a case where the first damper plate 24 and the second damper plate 25 are laminated together. In addition, on the second damper plate 25, together with the formation of the concave part 25a, a communication hole 25c communicating a convex part 25b and the second damper plate 25 including the convex part 25b is formed on the concave part 25a. As will be described below, the convex part 25b turns out to form a part of the first support part 70. As illustrated in FIGS. 3, 4A and 4B, the convex part 25b (a part of the first support part 70) is formed in the laminating direction below the position at which the pressure chamber 43 is formed. As illustrated in FIG. 4B, in a position at which the convex part 25b is not formed, it turns out that a space occurs on the top surface of the concave part 25a in a case where the first damper plate 24 and the second damper plate 25 are laminated together. Note that, although FIG. 4B illustrates a cross-section of the position including the communication hole 25c, the cross-section of the position at which neither the communication hole 25c nor the convex part 25b is formed turns out to have a space on the top surface of the concave part 25a, as illustrated by the dashed line of FIG. 4A. The communication hole 25c turns out to be a hole that brings the common liquid chamber 41 and the first damper chamber 47 into communication.

Subsequently, blocking the upper part of the space between the through-hole 24a and the concave part 25a with the spacer plate 23 results in formation of the first damper chamber 47 on the upper part of the common liquid chambers 41. In addition, it turns out that the first support part 70, which will be described below, is also formed. The first damper chamber 47 is in a state with air existing therein. As described above, the partition wall 25d functioning as a damper film which deforms due to pressure variation that has occurred in the common liquid chamber 41 allows for attenuating the pressure variation that has occurred in the common liquid chambers 41.

Although, in the present embodiment, the first damper chamber 47 is ellipse-shaped in plan view as illustrated in FIG. 2, the first damper chamber 47 is not limited to be ellipse-shaped but may take any shape provided that it fulfills the function of a damper film, with air allowed to exist therein.

The spacer plate 23 has a convex part 23a formed at a position facing the convex part 25b of the second damper plate 25. Accordingly, in a case where the first damper chamber 47 is formed, the convex part 23a formed on the spacer plate 23 overlaps with the convex part 25b formed on the concave part 25a of the second damper plate 25. Accordingly, the first support part 70 is formed in the first damper chamber 47. The first support part 70 supports the pressure chamber and the first damper chamber. Accordingly, there is exhibited an effect of suppressing deformation of the pressure chamber and the first damper chamber against the easiness of deformation of the pressure chamber in accordance with the widening and enlarging of the first damper chamber in the direction of alignment of the pressure chambers. As illustrated in FIG. 2, the plurality of first support parts 70 is provided inside the first damper chamber 47 corresponding to each row of pressure chambers. In addition, the plurality of first support parts 70 is formed with the same pitch as that of the plurality of pressure chambers 43 (or the plurality of nozzles 45). Note that the pitch is considered to be the same even in a case where there is variation of pitches due to production error or the like. Inside the first damper chamber 47 corresponding to each row of pressure chambers, a region in which the first support part 70 is formed and a region in which the first support part 70 is not formed lie in succession along the direction in which the plurality of pressure chambers is aligned. The first support part 70 functions to increase the rigidity of the pressure chamber 43. In a case where pressure for ejecting droplets is applied on the pressure chamber 43, excessive deformation of the pressure chamber 43 is suppressed by the first support part 70. Accordingly, it becomes possible to efficiently perform droplet ejection without dispersion of the pressure required for droplet ejection. Note that, although FIGS. 4A and 4B illustrate an example in which the first support part 70 is formed below the pressure chamber 43 in the laminating direction of the plates, this is not limiting. That is, the first support part 70 may be formed at a position in plan view in which it does not overlap with the pressure chamber 43. In addition, the first support part 70 can suppress bending deformation that may occur in the pressure chamber 43. A preferred shape of the first support part 70 for suppressing bending deformation that may occur in the pressure chamber 43 is desirably a shape along the longitudinal shape of the pressure chamber 43 as illustrated in FIG. 3, in order to achieve bending rigidity. In addition, as a preferred shape in a case where torsional deformation occurs in the pressure chamber 43, a shape of the first support part 70 is desirable which overlaps with a hypothetical line diagonally connecting the corners of the pressure chamber 43 in order to achieve torsional rigidity. It is desirable that the first support part 70 is formed in a manner abutting on two facing sides forming the first damper chamber 47.

Note that the aforementioned formation method of the first damper chamber 47 is only an example and is not limited thereto. For example, although FIG. 4A illustrates an example in which the top surface of the convex part 25b is formed at the same position as the top surface of the second damper plate 25 in the laminating direction of the plates, it may be formed under the top surface of the second damper plate 25. Also in such a case, blocking the upper space with the spacer plate 23 results in formation of the first support part 70. In addition, although there is illustrated an example in which the aforementioned first support part 70 is formed at a position at which a space is opened in the longitudinal direction (scanning direction in FIG. 2) of the pressure chamber 43 in the longitudinal section illustrated in FIG. 4A, this is not limiting. The first support part 70 may be formed in a manner abutting on either one of the internal side wall surfaces (the left or right side of FIGS. 4A and 4B) of the first damper chamber 47.

As has been described above, the communication hole 25c is formed so as to bring the first damper chamber 47 and the common liquid chambers 41 into communication. Due to such configuration, in a case where a large pressure variation has occurred in the common liquid chamber 41, not only is the partition wall 25d deformed, but the pressure variation in the common liquid chamber 41 directly transmits to the air in the first damper chamber 47. Accordingly, a suppressing effect of pressure variation can be obtained. The communication hole 25c has a straight-hole shape with which the hole diameter (cross-sectional area of the hole) does not vary in the hole axis direction. Here, the diameter of the communication hole 25c is 70 to 150 µm, for example, and may be made larger than the diameter of the nozzles 45 (15 to 20 µm, for example). In addition, although FIG. 2 illustrates an example in which the communication holes 25c are formed one by one with a predetermined pitch in the row direction of the rows of pressure chambers, it is not limited to this example. The communication holes 25c may be formed as sets of holes with a predetermined pitch in the row direction of rows of pressure chambers. In other words, the plurality of communication holes 25c may be formed in FIG. 4B.

Next, a formation method of the second damper chamber 48 will be described in detail. The second damper chamber 48 is formed of the third damper plate 28 located under the two manifold plates 26 and 27 in the laminating direction. The third damper plate 28 has a concave part 28a formed on the lower surface of the part facing the common liquid chamber 41 in the laminating direction, the concave part 28a extending in the longitudinal direction of the common liquid chamber 41. Subsequently, blocking the lower space of the concave part 28a with the cover plate 29 under thereof in the laminating direction results in formation of the second damper chamber 48 under the common liquid chamber 41. Similarly to the first damper chamber 47, the width of the second damper chamber 48 can be equal to or larger than the width of the common liquid chambers 41. Although FIGS. 4A and 4B illustrate an example in which the width of the second damper chamber 48 is substantially the same as the width of the first damper chamber 47, they may be different in size.

The second damper chamber 48 is also in a state with air existing therein similarly to the first damper chamber 47, and a partition wall 28b between the common liquid chambers 41 and the second damper chamber 48 functions as a damper film which deforms due to pressure variation that has occurred in the common liquid chambers 41. Accordingly, pressure variation that has occurred in the common liquid chambers 41 is suppressed. In addition, a second support part (not illustrated) for increasing the rigidity of the flow path unit 31 may be provided in the second damper chamber 48. The second support part (not illustrated) may be formed with the same material as that of the third damper plate. Although the second support part (not illustrated) is preferably formed directly under the first support part 70, it may be formed at a different position.

Here, the aforementioned holes and concave parts provided on the plates 20 to 30 to form the flow path structure and damper chambers are formed by etching, press working or laser processing.

Next, the piezo actuator 32 will be described. As illustrated in FIGS. 2 to 4B, the piezo actuator 32 has a vibration plate 50 provided on the top surface of the flow path unit 31 in the laminating direction in a manner covering the plurality of pressure chambers 43. The top surface of the vibration plate 50 is provided with a piezoelectric layer 51 arranged in a manner facing the plurality of pressure chambers 43, and with a plurality of individual electrodes 52 arranged on the top surface of the piezoelectric layer 51.

The vibration plate 50, which is made of a metal material, is joined with the flow path unit 31 in a state being arranged on the top surface of the flow path unit 31 in a manner covering the plurality of pressure chambers 43. In addition, the top surface of the electroconductive vibration plate 50 also serves as a common electrode. In other words, providing the top surface of the vibration plate 50 at the side of the lower surface of the piezoelectric layer 51 results in formation of a common electrode that generates an electric field applied to the piezoelectric layer 51 in the thickness direction between the vibration plate 50 and the plurality of individual electrodes 52 on the top surface of the piezoelectric layer 51. The vibration plate 50 serving as a common electrode is connected to the ground wiring of a driver IC 53 and maintained at ground potential.

The piezoelectric layer 51 is made of a piezoelectric material having lead zirconate titanate (PZT) as a major component, which is a ferroelectric solid solution of lead titanate and lead zirconate, and is formed into a flat plate. As illustrated in FIGS. 2 to 4B, the piezoelectric layer 51 is continuously formed on the top surface of the vibration plate 50 in the laminating direction across the plurality of pressure chambers 43. The region facing the plurality of pressure chambers 43 on the top surface of the piezoelectric layer 51 has the plurality of individual electrodes 52 respectively provided thereon. Each individual electrode 52, having a substantially elliptic, planar shape which is relatively smaller than the pressure chamber 43, faces the central part of the pressure chamber 43. In addition, a plurality of contact parts 52a is respectively drawn from the end parts of the plurality of individual electrodes 52, along the longitudinal direction of the individual electrodes 52.

The plurality of contact parts 52a respectively corresponding to the plurality of individual electrodes 52 has connected thereto a flexible wiring board (not illustrated) having installed thereon the driver IC 53 that drives the piezo actuator 32. The driver IC 53 is then electrically connected to the plurality of individual electrodes 52 and the vibration plate 50 serving as a common electrode via wiring formed on the flexible wiring board. In addition, the flexible wiring board is further connected to a main control board (not illustrated) of the inkjet printer 1. The driver IC 53 then, upon receiving an instruction from the main control board, supplies each of the plurality of individual electrodes 52 with a drive pulse signal, and applies a predetermined drive voltage on an active part (not illustrated) of the individual electrode.

Next, an operation of the piezo actuator 32 in a case where a drive pulse signal is supplied will be described. Upon supplying a drive pulse signal from the driver IC 53 to a certain individual electrode 52, a predetermined drive voltage is applied on an active part sandwiched between the individual electrode 52 and the vibration plate 50 serving as a common electrode maintained at ground potential, and an electric field in the thickness direction acts on the active part. Accordingly, the active part shrinks in the surface direction perpendicular to the thickness direction, whereby a part covering the pressure chamber 43 of the vibration plate 50 deforms in accordance with the shrinking so as to protrude toward the pressure chamber 43 side. On this occasion, the volume inside the pressure chamber 43 decreases to rise the ink pressure in the pressure chamber 43, whereby ink is ejected from the nozzle 45 communicating with the pressure chamber 43.

In a case where pressure is simultaneously applied on inks in the plurality of pressure chambers 43 by the piezo actuator 32 in order to eject droplets of ink from the plurality of nozzles 45, there is a concern that a large pressure variation may occur in the common liquid chamber 41 due to propagation of a residual pressure wave in the pressure chamber 43. However, as illustrated in FIGS. 4A and 4B, providing the first damper chamber 47 on the common liquid chamber 41 suppresses the pressure variation in the common liquid chamber 41. Furthermore, providing the first support part 70 on the partition wall 25d partitioning the first damper chamber 47 and the common liquid chamber 41 has increased the rigidity of the pressure chamber 43. Accordingly, it becomes possible to efficiently perform droplet ejection in a case where pressure for ejecting droplets has been applied on the pressure chamber 43, without dispersion of the pressure required for droplet ejection.

Subsequently, modifications resulting from making various changes to the embodiment will be described. However, description of components having a similar configuration as the aforementioned embodiment will be omitted as appropriate.

Embodiment 2

Embodiment 1 has described an implementation in which one row (or a single member) of the first damper chambers 47 is formed for one pressure chamber row (a row of the plurality of pressure chambers 43 corresponding to a single member of the common liquid chambers 41) in which the plurality of pressure chambers 43 is arranged. However, the first damper chamber 47 to be arranged for one pressure chamber row is not limited to that described in Embodiment 1. Another implementation will be described in the present embodiment.

Figure 5:
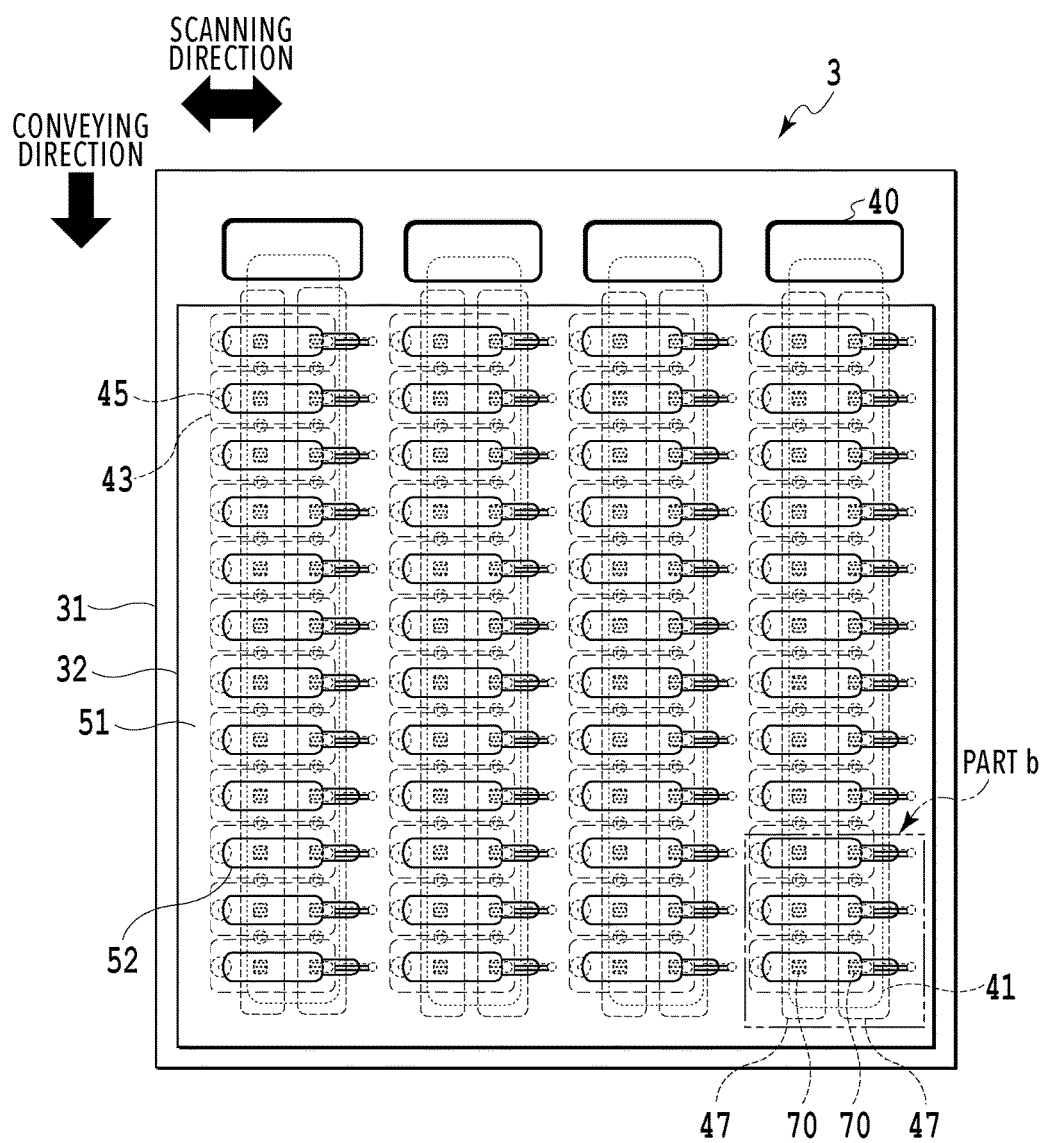
FIG. 5 is a plan view of an inkjet head.
Figure 6:
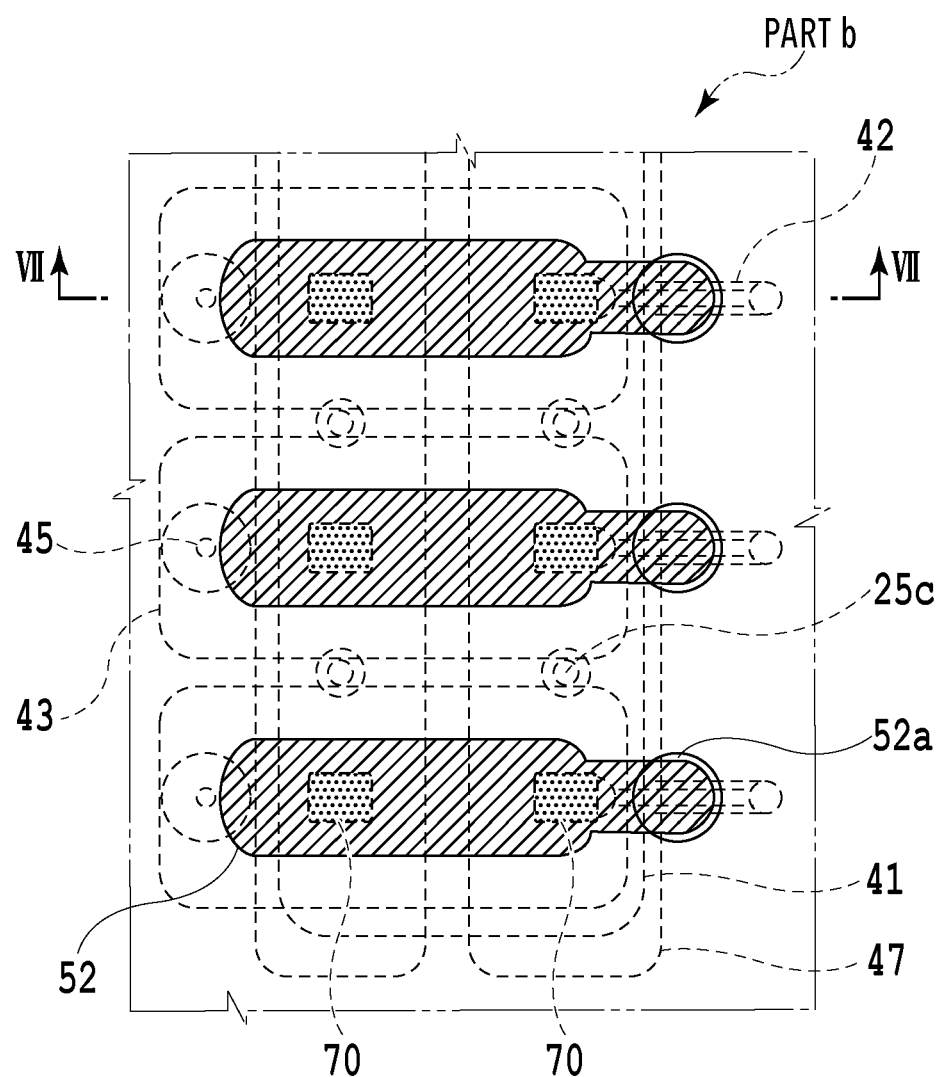
FIG. 6 is a partially enlarged view of FIG. 5.
Figure 7:
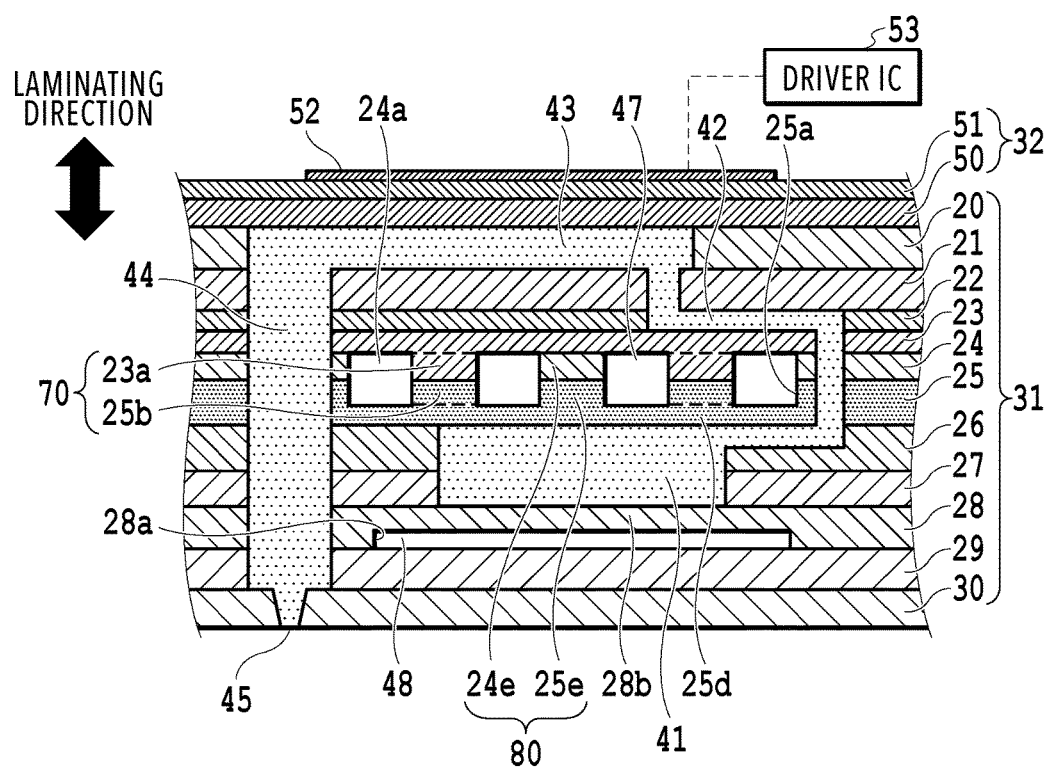
FIG. 7 is a cross-sectional view taken along line VII-VII of FIG. 6.

FIG. 5 is a schematic plan view of the inkjet head 3 of the present embodiment. FIG. 6 is a partially enlarged view of the part "b" of FIG. 5. FIG. 7 is a cross-sectional view taken along line VII-VII of FIG. 6. In the present embodiment, two rows of the first damper chambers 47 are formed for one pressure chamber row corresponding to a single member of the common liquid chambers as illustrated in FIGS. 5 to 7. A beam 80 formed of a part 24e of the first damper plate 24 and a part 25e of the second damper plate 25 exists along a row of the pressure chamber between the first damper chambers 47 aligned in the aforementioned row. Accordingly, it is possible to increase the rigidity of the inkjet head 3 itself.

In addition, the first support part 70 is formed, respectively, in the two members of the first damper chambers 47 arranged in two rows. Note that any shape or number of the first support part 70 will do, provided that the rigidity required for the pressure chamber can be maintained by the first support part 70 to be disposed.

In addition, although FIG. 7 illustrates an example in which the beam 80 exists between two rows of the first damper chambers 47, this is not limiting. As has been described in Embodiment 1, the through-hole 24a may be formed in the first damper plate 24 and, as for the position corresponding to the beam 80, a support part similar to the beam 80 may be formed by laminating the spacer plate 23 of the convex part under thereof along the row of pressure chambers.

Note that, although FIGS. 5 to 7 illustrate an example of forming two rows of the first damper chambers 47 for one pressure chamber row, the number of rows is not limited to two and therefore three or more rows of the first damper chambers 47 may be formed.

Embodiment 3

Embodiment 1 has described an implementation in which one row (or a single member) of the first damper chambers 47 is formed for one pressure chamber row (a row of the plurality of pressure chambers 43 corresponding to a single member of the common liquid chambers 41) in which the plurality of pressure chambers 43 is arranged. The present embodiment describes an implementation in which a single member of the first damper chambers 47 is formed for more than one of a plurality of rows of pressure chambers each including the plurality of pressure chambers 43 arranged therein. Here, the present embodiment describes an implementation in which a single member of the first damper chambers 47 is formed for all rows of pressure chambers each including the plurality of pressure chambers 43 arranged therein.

Figure 8:
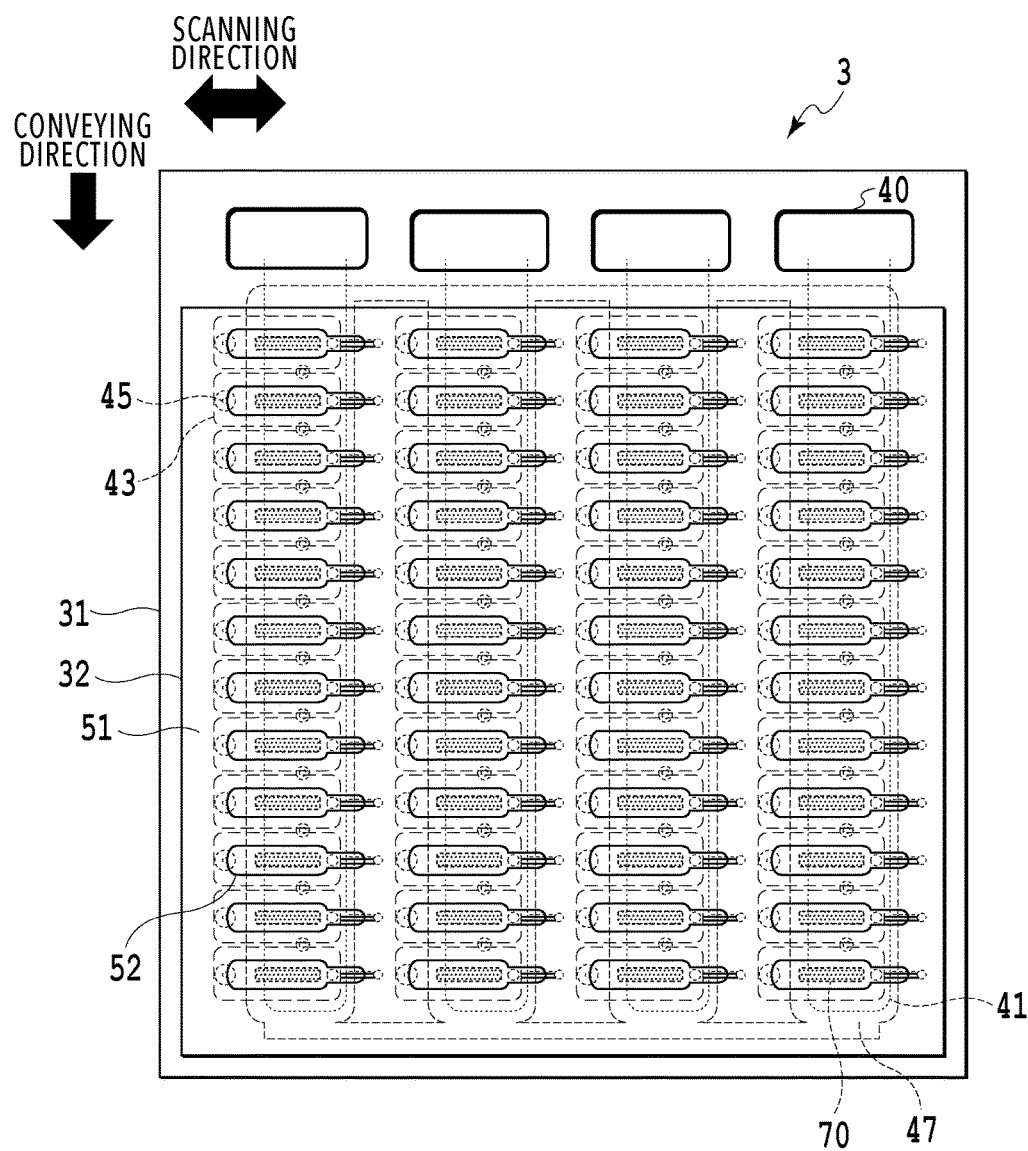
FIG. 8 is a plan view of an inkjet head.

FIG. 8 is a schematic plan view of the inkjet head 3 of the present embodiment. As illustrated in FIG. 8, a single member of the first damper chambers 47 is provided for all the pressure chamber rows. According to the implementation, the size of the first damper chamber 47 can be made large. Therefore, attenuation effect of pressure variation increases, whereby the second damper chamber 48 need not be formed.

Note that, although FIG. 8 illustrates an exemplary implementation in which a single member of the first damper chambers 47 is provided for all the pressure chamber rows, this is not limiting. For example, as has been described in Embodiment 1 or Embodiment 2, there may be employed a configuration having provided therein, in a case where a pressure chamber system of four rows exists, two first damper chambers 47 each including two rows thereof. Alternatively, there may be employed a configuration having provided therein the first damper chamber 47 including three rows and the first damper chamber 47 corresponding to one row.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent No. 2017-039729, filed Mar. 2, 2017, and Japanese Patent Application No. 2017-236397, filed Dec. 8, 2017, which are hereby incorporated by reference herein in their entireties.

What is claimed is:

1. A droplet ejection apparatus comprising: a flow path unit having formed therein a liquid flow path including a plurality of nozzles, a plurality of pressure chambers respectively in communication with each of the plurality of nozzles, and a common liquid chamber in communication with the plurality of pressure chambers; and an actuator configured to selectively apply pressure to liquid in the plurality of pressure chambers, wherein
the flow path unit is formed by laminating a plurality of lamination plates,
the flow path unit further has a first damper chamber extending in a manner overlapping with the plurality of pressure chambers with respect to a longitudinal direction in which the plurality of pressure chambers is aligned, as seen from an opening side of the plurality of nozzles,
the first damper chamber being provided at a height between the plurality of pressure chambers and the common liquid chamber, as measured along the laminating direction in which the plurality of lamination plates is laminated, and
a first support part is provided inside the first damper chamber.

2. The droplet ejection apparatus according to claim 1, wherein the first support part is provided as a plurality of first support parts inside the first damper chamber.

3. The droplet ejection apparatus according to claim 2, wherein the plurality of first support parts is arranged with a same pitch as that of the plurality of pressure chambers.

4. The droplet ejection apparatus according to claim 2, wherein the plurality of first support parts is arranged with a same pitch as that of the plurality of nozzles.

5. The droplet ejection apparatus according to claim 2, wherein, inside the first damper chamber, a region in which the first support part is formed and a region in which the first support part is not formed lie in succession along the direction in which the plurality of pressure chambers is aligned.

6. The droplet ejection apparatus according to claim 1, wherein the first support part abuts on two facing sides forming the first damper chamber.

7. The droplet ejection apparatus according to claim 1, wherein the first support part is arranged in a manner overlapping with a part of the pressure chamber, as seen from the opening side of the plurality of nozzles.

8. The droplet ejection apparatus according to claim 1, wherein the first support part has a shape along a longitudinal shape of the pressure chamber.

9. The droplet ejection apparatus according to claim 1, wherein the first support part has a shape overlapping with a hypothetical line diagonally connecting the corners of the pressure chamber, as seen from the opening side of the plurality of nozzles.

10. The droplet ejection apparatus according to claim 1, wherein a width of the first damper chamber in a direction perpendicular to the laminating direction is equal to or larger than a width of the common liquid chamber in the direction perpendicular to the laminating direction.

11. The droplet ejection apparatus according to claim 1, wherein the first support part is formed by a convex part provided in a first plate and a convex part provided in a second plate that is positioned under the first plate in the laminating direction.

12. The droplet ejection apparatus according to claim 11, wherein
the first damper chamber is formed by a through-hole of a third plate between the first plate and the second plate, and a concave part provided on the second plate, and
the convex part provided on the second plate is formed on the concave part provided on the second plate.

13. The droplet ejection apparatus according to claim 1, wherein the flow path unit further has a communication hole which brings the first damper chamber and the common liquid chamber into communication.

14. The droplet ejection apparatus according to claim 1, wherein the flow path unit further has a second damper chamber separately from the first damper chamber.

15. The droplet ejection apparatus according to claim 14, wherein the common liquid chamber is provided between the first damper chamber and the second damper chamber in the laminating direction.

16. The droplet ejection apparatus according to claim 14, wherein one or more second support parts are formed inside the second damper chamber.

17. The droplet ejection apparatus according to claim 1, wherein a plurality of the first damper chambers is provided in a manner overlapping with a plurality of pressure chambers in a pressure chamber row including a plurality of pressure chambers, as seen from the opening side of the plurality of nozzles.

18. The droplet ejection apparatus according to claim 17, wherein a beam is formed between the plurality of first damper chambers.

\* \* \* \* \*